United States Patent [19]
Komatsu

[11] Patent Number: 5,619,057
[45] Date of Patent: Apr. 8, 1997

[54] COMPLEX FILM OVERLYING A SUBSTRATE WITH DEFINED WORK FUNCTION

[75] Inventor: Hiroshi Komatsu, Kanagawa, Japan

[73] Assignee: Sony Corporation, Tokyo, Japan

[21] Appl. No.: 634,951

[22] Filed: Apr. 19, 1996

Related U.S. Application Data

[63] Continuation of Ser. No. 362,918, Dec. 23, 1994, abandoned.

[30] Foreign Application Priority Data

Jan. 19, 1994 [JP] Japan ................................. 6-018990
Jul. 13, 1994 [JP] Japan ................................. 6-184087

[51] Int. Cl.⁶ .......................... H01L 29/76; H01L 29/94; H01L 31/119
[52] U.S. Cl. .......................... 257/382; 257/384; 257/407; 257/412; 257/413
[58] Field of Search .................................. 257/382, 383, 257/384, 407, 412, 413, 754, 755, 763, 768, 770, 775, 388, 377

[56] References Cited

U.S. PATENT DOCUMENTS

| | | | |
|---|---|---|---|
| 3,830,657 | 8/1974 | Farrar | 257/750 |
| 5,084,413 | 1/1992 | Fujita et al. | 257/763 |
| 5,177,569 | 1/1993 | Koyama et al. | 257/412 |

FOREIGN PATENT DOCUMENTS

| | | | |
|---|---|---|---|
| 4364073 | 12/1992 | Japan | 257/413 |
| 5129630 | 5/1993 | Japan | 257/412 |

OTHER PUBLICATIONS

Lightly Impurity Doped (LD) Mo Silicide Gate Technology, Kakumu et al, IEDM85–415, 1985, IEEE.

The Growth of Hemisphere–grain (HSG) on the Polysilicon Surface . . . (17P–ZQ–9), Sugiyama et al., 1991.

Primary Examiner—Minhloan Tran
Attorney, Agent, or Firm—Hill, Steadman & Simpson

[57] ABSTRACT

Disclosed is a method and an apparatus for making devices with low barrier height. In fabricating an n-channel and p-channel devices, hemisphere grains, silicon crystal grains and metal silicide crystal grains are formed on a contact-hole or a gate electrode on an insulating film in each semiconductor element, so that it becomes possible to control the work function, to reduce the contact resistance, and to control the threshold voltage $V_{th}$.

5 Claims, 8 Drawing Sheets

F I G. 5A
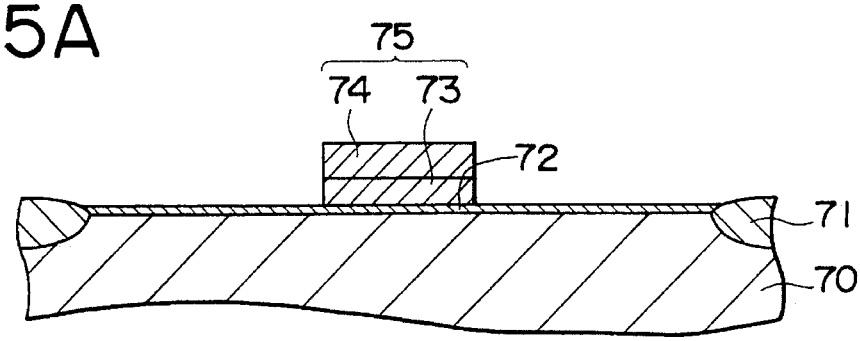
F I G. 5B
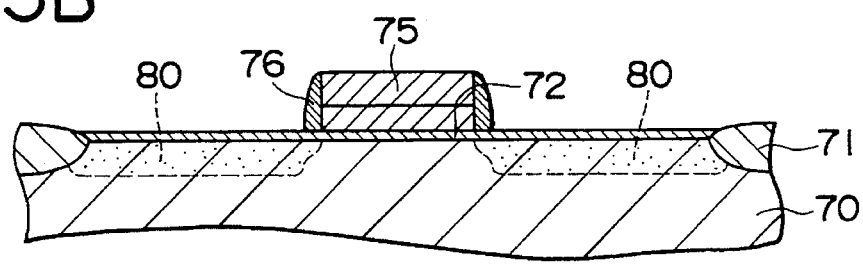
F I G. 5C
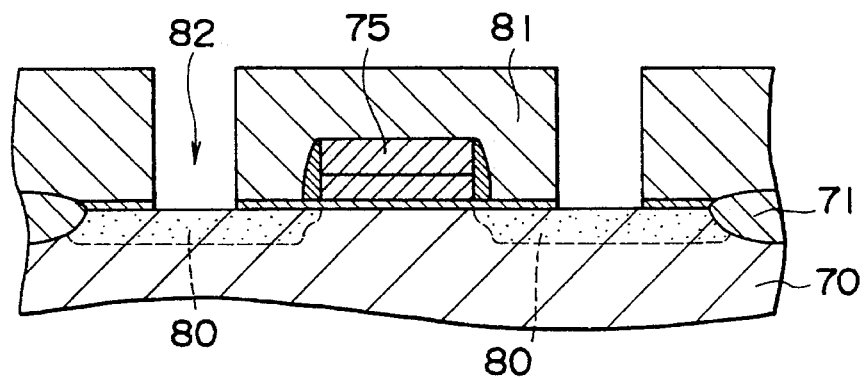
F I G. 5D
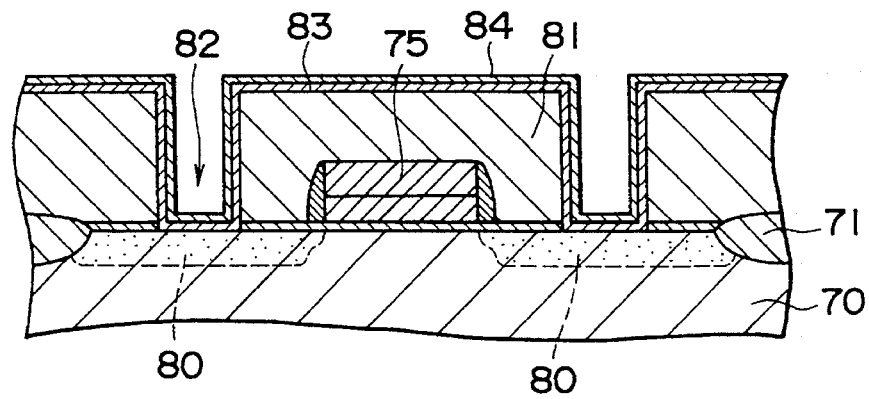

COMPLEX FILM OVERLYING A SUBSTRATE WITH DEFINED WORK FUNCTION

This is a continuation of application Ser. No. 08/362,918, filed Dec. 23, 1994, now abandoned.

BACKGROUND OF THE INVENTION

1. Field of the Invention

The present invention relates to a complex film controlled in its work function at the interface with a substrate under layer, which is applicable for a gate electrode of an MOS transistor and a contact-hole of an interconnect structure of a semiconductor device, and a formation method thereof; and an MOS transistor and an interconnect structure using the complex film and fabrication methods thereof.

2. Description of the Related Art

In a semiconductor device, an SOI (Silicon on Insulator) has been used to simplify the perfect separation between semiconductor elements and to suppress soft error and the latch-up phenomenon inherent to a CMOS transistor. In the relatively early days, an SOI structure having a silicon active layer of about 500 nm in thickness had been examined to increase the speed and reliability of an LSI of CMOS transistors. Recently, it has been known that, by depleting the entire silicon active layer formed on the surface of an SOI by means of thinning the silicon active layer to about 100 nm and controlling the concentration of impurities in a channel region to be relatively low, there can be obtained an excellent semiconductor element capable of suppressing the short-channel effect and improving the current drive ability of an MOS transistor.

However, in an n-type MOS transistor using the general n+-polysilicon as a gate electrode material, the concentration of impurities in the channel region must be increased to be about $10^{17}/cm^2$ or more to ensure the threshold voltage $V_{th}$ at about 0.5–1.0 V (which is the value for the usual enhancement transistor). Consequently, from the viewpoint of the threshold voltage $V_{th}$, it becomes difficult to form a channel region having a relatively low concentration of impurities.

For this reason, in recent years, an examination has been made to use a p+-polysilicon (B-DOPOS) doped with boron as a gate electrode material. In this case, a channel region having a sufficiently low concentration of impurities is formed, and thereby a perfect depletion type transistor can be fabricated. The threshold voltage $V_{th}$ of this perfect depletion type transistor becomes a specified value which is not dependent on the thickness of a silicon active layer of an SOI; however, this value is as high as about 1.0 V for a future LSI aiming at the low power voltage, thereby limiting the design for semiconductors.

In view of the foregoing, it is desirable for the design of the future fine semiconductor elements to control the threshold voltage $V_{th}$ by controlling the work function at the interface between the gate electrode of an MOS transistor and the backing silicon layer.

On the other hand, in an interconnect structure of a semiconductor device, a large number of contact-holes are formed. The contact-hole is provided on an insulating interlayer formed on an impurity diffusion region (source/drain region) to connect the impurity diffusion region to an upper interconnect layer. Specifically, an insulating interlayer is formed on a silicon semiconductor substrate formed with an impurity diffusion region and an opening is provided in the insulating interlayer, after which a metallization material is deposited in the opening and on the insulating interlayer, thus forming a contact-hole in which the metallization material is embedded in the opening. The metallization material deposited on the insulating interlayer is patterned in a desired pattern, to thus form the upper interconnect layer.

In such a contact-hole, the work function at the interface between the contact-hole at the bottom portion of the opening and the silicon semiconductor substrate is dependent on the metallization material used. Namely, the contact resistance is determined by the work function of the metallization material and the concentration of impurities in the impurity diffusion region.

In a CMOS transistor element, the contact-hole must be formed on an n+-Si for an n-type MOS transistor, and on p+-Si for a p-type MOS transistor. However, in the case of using the same metallization material contacted with the n+-Si and p+-Si, it becomes impossible to simultaneously lower the barrier heights in an energy band diagram for the n+-Si and p+-Si. In the case of using a polysilicon replaced with the metallization material, it becomes possible to simultaneously lower the barrier heights for the n+-Si and p+-Si. However, the resistance of polysilicon itself is difficult to be lowered, and therefore, for an LSI required for a fine structure, polysilicon is not suitable to be used as the interconnecting material for the contact-hole.

Moreover, a serious problem is the increase in the contact resistance in the contact-hole, that is, an increase in the contact resistance between the metallization material forming the contact hole and the source/drain region. By uniformly reducing elements forming a semiconductor device to be 1/S, the integration is improved to be $S^2$ times without any change in the chip area and power consumption; however, at the same time, the contact resistance having a constant resistivity is also increased to be $S^2$ times. The reduction in the contact resistance, therefore, is an inevitable subject for achieving high fineness and high integration of a semiconductor device.

The contact resistivity $\rho_c$ between n+ silicon and a metal as a metallization material is expressed by the following equation:

$$\rho_c = \exp(C_2 \cdot \phi_{bn} \sqrt{N_d}) \quad (1)$$

where $$C_2 = \pi \sqrt{(m_n \cdot \epsilon_s)}/h$$

In the above equation, $\phi_{bn}$ is a barrier height in an energy band diagram which is generally determined between the concentration of n-type impurities in silicon and a metal; $\sqrt{N_d}$ is the donor concentration in silicon; $m_n$ is the effective mass of an electron; and $\epsilon_s$ is a permeability of silicon.

As the process temperature in a process of fabricating a semiconductor device has been lowered, it has become difficult to obtain a desired concentration or activity ratio of impurities in silicon. Moreover, as is apparent from the equation (1), the barrier height $\phi_{bn}$ is present as the first power in the exponent term, so that the effect of the barrier height $\phi_{bn}$ exerted on the contact resistivity $\rho_c$ is very large. On the other hand, when a metal as a metallization material is determined, the band gap $E_g$ of a semiconductor silicon is expressed by the following equation:

$$E_g = q(\phi_{bn} + \phi_{bp})$$

where $\phi_{bp}$ is a barrier height generally determined between the concentration of p-type impurities in silicon and the metal; and q is an elementary quantity of electric charge.

Accordingly, as the value $\phi_{bn}$ for the n-type semiconductor silicon is reduced, the value $\phi_{bp}$ for the p-type semiconductor silicon is increased; and vice versa. Therefore, it is impossible to simultaneously reduce the values $\phi_{bn}$ and $\phi_{bp}$. In other words, in a complementary MOS transistor (CMOS) having n-type and p-type channel MOS transistors, it is impossible to simultaneously reduce the contact resistances of the n-type channel and the p-type channel MOS transistors using one kind of a metallization material.

It becomes possible to simultaneously reduce the contact resistances of the n-type and p-type channel MOS transistors using different metallization materials for the contact-holes of the n-type and p-type channel MOS transistors; however, this method presents a problem in significantly complicating the fabricating process for the CMOS transistor.

A technique of fabricating gate electrodes of an n-type and p-type channel MOS transistor elements has been known in ["LIGHTLY IMPURITY DOPED (LD) Mo SILICIDE GATE TECHNOLOGY", MASAKAZU KAKUMU, et al., Abstract of IEDM, pp. 415 (15.5), 1985]. The technique involves forming a gate oxide; forming a molybdenum silicide layer rich in silicon by sputtering; implanting ions of arsenic in a region, on which a n-type channel MOS transistor element is to be formed, of the molybdenum silicide layer; implanting ions of boron in a region, on which a p-type channel MOS transistor element is to be formed, of a molybdenum silicide layer; and patterning the molybdenum silicide layer. In this document, it is reported that silicon atoms are precipitated on the molybdenum silicide layer near the interface between the molybdenum silicide layer and the gate oxide film after the heating process. Moreover, there appears the description that the work function $\phi_m$ of the molybdenum silicide forming the gate electrode can be accurately controlled by the amount of the implanted ions. However, there is no description regarding the reduction in the resistance of the contact-hole, particularly the reduction in the contact-holes formed on an n-type and p-type channel MOS transistor elements in a CMOS transistor.

OBJECT AND SUMMARY OF THE INVENTION

An object of the present invention is to provide a complex film capable of controlling a work function at the interface with the substrate under layer and a method of forming the complex film.

Another object of the present invention is to provide an MOS transistor capable of controlling a threshold $V_{th}$ irrespective of the concentration of impurities in a channel region by controlling the work function between a gate electrode and the substrate under layer, and a method of fabricating the MOS transistor.

A further object of the present invention is to provide an interconnect structure including a contact-hole capable of lowering a barrier height with an impurity diffusion region and of reducing the constant resistance, and a method of forming the interconnect structure.

To achieve the above object, according to the present invention there is provided a complex film comprising:

(a) an island-like region formed on a substrate; and (b) a thin film formed of a material different from that of the island-like region for covering the substrate and the island-like region, wherein a work function between the substrate and the complex film is controlled by adjusting the area of the island-like region per unit area of the substrate.

In the complex film of the present invention, a material forming the island-like region may comprise a semiconductor material, or a material for forming the thin film may comprise a semiconductor material. In this case, the semiconductor material may include silicon, silicon doped with impurities, or silicon selectively doped with impurities.

In the complex film of the present invention, a material for forming the thin film may comprise a silicide or a metal. In this case, the silicide may include tungsten silicide ($WSi_x$), and the metal may include titanium (Ti).

To achieve the object, according to the present invention there is provided an MOS transistor having a gate electrode comprising the above-described complex film of the present invention.

To achieve the object, according to the present invention, there is provided an interconnect structure of a semiconductor device comprising a contact-hole having at the bottom portion the above-described complex film of the present invention.

To achieve the above object, according to the present invention, there is provided a method of forming a complex film comprising:

(a) a process of forming an island-like region on a substrate while controlling the covering area of the island-like region per unit area of a substrate; and (b) a process of covering the substrate and the island-like region with a thin film made of a material different from that of the island-like region;

wherein a work function at the interface between the substrate and the complex film by adjusting the area of the island-like region per unit area of the substrate.

In the method of forming the complex film of the present invention, the island-like region or the thin film may be formed of a semiconductor material using CVD. In this case, the semiconductor material may comprise silicon. The island-like region or thin film formed by CVD may be doped with impurities. Moreover, the island-like region or the thin film formed of silicon by CVD may be selectively doped with impurities.

In the method of forming a complex film of the present invention, the island-like or thin film may be formed of a silicide or a metal by CVD. In this case, the silicide may comprise tungsten silicide ($WSi_x$) formed by CVD.

In the method of forming a complex film of the present invention, the thin film may be formed by sputtering. In this case, the thin film may be formed of titanium.

To achieve the object, according to the present invention there is provide a method of fabricating an MOS transistor, which comprises the step of forming a gate electrode by the above-described complex film forming method of the present invention.

To achieve the object, according to the present invention, there is provided a method of forming an interconnect structure of a semiconductor device, which comprises the step of forming a complex film on the bottom portion of a contact-hole by the above-described complex film forming method of the present invention.

In the case of depositing a material on a substrate by chemical vapor-phase deposition (CVD) using the surface reaction, the initial nucleation site and morphology of a material is significantly changed depending on the surface state of the substrate under layer under the specified condition. When the nucleation site per unit area of the substrate is small, by suitably setting the CVD condition, the material formed by CVD becomes not a continuous film, but rather grows in an island, thus forming island-like regions. By depositing a thin film having a different work function on the island-like regions, the work function of the complex film against the substrate can be changed, depending on the state of the growth interface (mainly the covering ratio of the island-like regions and thin film to the substrate), or depending on the materials for forming the substrate, island-like regions and thin film.

To achieve the above object, according to the present invention there is provided a method of forming a contact-hole for a semiconductor element comprising:

(a) a process of forming a source/drain region on a silicon semiconductor substrate, forming an insulating layer over the whole surface, and forming an opening in the insulating layer over the source/drain region;

(b) a process of forming a metal layer at least in the opening, and implanting ions of an impurity having the same conducting type as that of the source/drain region in the metal layer;

(c) a process of heating the silicon semiconductor substrate for allowing the metal forming the metal layer on the bottom portion of the opening to react with silicon forming the silicon semiconductor substrate thereby forming a metal silicide layer on the bottom portion of the opening, precipitating silicon crystal grains in the metal silicide layer at and near the interface with the source/drain region on the bottom portion of the opening, and activating the impurity implanted and entrapped in the precipitated silicon crystal grains; and (d) a process of depositing a metallization material at least in the opening.

In the method of forming a contact-hole of a semiconductor element according to the present invention, the metal layer preferably comprises titanium, tungsten, molybdenum or tantalum. Moreover, the metal layer may be formed by a physical vapor-phase growth method such as sputtering or vacuum deposition, or a chemical vapor-phase growth method.

To achieve the object, according to the present invention, there is provided a method of forming a contact-hole of a semiconductor element comprising:

(a) a process of forming a source/drain region on a substrate, forming an insulating layer over the whole surface, and forming an opening in the insulating layer over the source/drain region;

(b) a process of forming a metal silicide layer rich in silicon at least in the opening, and implanting ions of an impurity having the same conducting type as that of the source/drain region in the metal silicide layer;

(c) heating the substrate for precipitating silicon crystal grains in the metal silicide layer at and near the interface with the source/drain region on the bottom portion of the opening, and activating the impurity implanted and entrapped in the precipitated silicon crystal grains; and (d) a process of depositing a metallization material at least in the opening.

Here, the metal silicide layer rich in silicon means a metal silicide layer wherein Si is contained in an amount larger than the content determined by the stoichiometry composition. For example, for a WiS$_x$ system, two kinds of W$_5$Si$_3$ and WSi$_2$ are present as stable crystal phases; however, when Si is added in a large amount, WSi$_2$ becomes more stable. At this time, the WSi$_x$ in which the ratio of Si/W is larger than 2/1 (that is, x>2) is called a metal silicide layer rich in silicon (in this example, tungsten silicide layer rich in silicon).

In the method of forming a contact-hole of a semiconductor element according to the present invention, the metal silicide layer may comprise titanium silicide, tungsten silicide, molybdenum silicide or tantalum silicide. Moreover, the metal silicide layer may be formed by a physical vapor-phase growth method, such as sputtering or vacuum deposition, or a chemical vapor-phase growth method.

To achieve the above object, according to the present invention there is provided a contact-hole of a semiconductor element which is electrically connected to a source/drain region formed on a substrate, comprising:

a metal silicide layer formed at least on the bottom portion; and a metallization material formed on the metal silicide layer;

wherein silicon crystal grains containing to a large extent an impurity having the same conducting type as that of the source/drain region are formed in the metal silicide layer at and near the interface with the source/drain region.

In the contact-hole of a semiconductor element according to the present invention, the metal silicide layer may comprise titanium silicide, tungsten silicide, molybdenum silicide or tantalum silicide.

Moreover, the work function of the metal silicide layer at the interface between the source/drain region and the metal silicide layer is controlled, by the ratio between the total area of the metal silicide crystal grains in the metal silicide layer at the interface with the source/drain region and the total area of silicon crystal grains in the metal silicide layer at the interface with the source/drain region, and/or by the concentration of the impurity contained in the silicon crystal grains.

The concentration of the impurity contained in silicon crystal grains is preferably $2.0 \times 10^{18} - 1.0 \times 10^{21}$ cm$^3$, and more preferably $1.0 \times 10^{20} - 1.0 \times 10^{21}$/cm$^3$.

In a method of forming a contact-hole of a semiconductor element of the present invention, a silicon semiconductor substrate is heated so that a metal forming a metal layer on the bottom portion of an opening reacts with silicon forming the silicon semiconductor substrate, thereby forming a metal silicide layer on the bottom portion of the opening, and silicon crystal grains are precipitated in the metal silicide layer at and near the interface with the source/drain region on the bottom portion of the opening. In this case, since ions of an impurity are previously implanted in the metal layer, the impurity is entrapped to a large extent in the precipitated silicon crystal grains. In the method of forming a contact-hole according to the present invention, the substrate is heated so that silicon crystal grains are precipitated in a metal silicide layer at and near the interface with a source/drain region on the bottom of an opening. At this time, since ions of an impurity are previously implanted in the metal silicide layer, the impurity is entrapped to a large extent in the precipitated silicon crystal grains. The concentration of the entrapped impurity is controlled by the dose of the impurity upon ion-implantation.

The work function of the metal silicide layer at the interface between the metal silicide layer and the source/drain region is finally determined by the work function determined depending on the ratio between the total area of the silicon crystal grains precipitated after heating of a silicon semiconductor substrate and the total area of the metal silicide crystal grains. Moreover, in the n-channel and p-channel MOS transistor elements, the value of $\sqrt{N_d}$ in the equation (1) becomes larger. As a result, in either of the MOS transistor elements, it becomes possible to reduce the contact resistance $\rho_c$ between the metal silicide layer at the bottom portion of the opening and the source/drain region.

In the method of forming a contact-hole of a semiconductor element of the present invention, a metal silicide layer rich in silicon is formed in an opening. Accordingly, this method has excellent controllability for the amount of the precipitated silicon crystal grains. In other words, by optimizing the condition of forming a metal silicide layer rich in silicon and the heating condition of a substrate, the ratio between the total area of the precipitated silicon crystal grains and the total area of the metal silicide crystal grains can be controlled. As a result, it becomes possible to enhance the controllability of the work function of the metal silicide layer at the interface between the metal silicide layer and the source/drain region, and to enlarge the range of the value of the controllable work function.

As described above, in the n-channel and p-channel devices, by implanting ions of an impurity having the same conducting type as that of a source/drain region in a metal layer or a metal silicide layer, the conducting type of the precipitated silicon crystal grains is made to be n-type or p-type, and the concentration of the impurity in the silicon crystal grains can be controlled by the dose of the impurity upon ion-implantation. Accordingly, it becomes possible to form the metal silicide layers having different work functions on the same silicon semiconductor substrate on the basis of one kind of metal or metal silicide. As a result, for example in a CMOS transistor formed with n-channel and p-channel MOS transistor elements, it becomes possible to simultaneously reduce the contact resistances in the n-channel and p-channel MOS transistors using one kind of metal or metal silicide. In addition, the average composition, $MSi_x$ (M: metal) of the metal silicide layer containing the precipitated silicon crystal grains is gently changed in the direction of separating from the interface with the source/drain region, so that the work function is also gently changed.

In the conventional method of forming a contact-hole in which ions of an impurity are not implanted in a metal layer or a silicon rich metal silicide layer formed in an opening, even by heating a silicon semiconductor substrate and precipitating silicon crystal grains in a metal silicide layer at and near the interface with the source/drain region on the bottom portion of the opening, the impurity present in the source/drain region is entrapped in the metal silicide layer. As a result, it is very difficult to allow the silicon crystal grains precipitated at the interface between the source/drain region and the metal silicide layer to contain the impurity in a high concentration. Accordingly, the metal silicide layers at and near the interface with the source/drain region formed on the same silicon semiconductor substrate have the same work function, so that it is impossible to simultaneously reduce the contact resistances in the n-channel and p-channel MOS transistors.

BRIEF DESCRIPTION OF THE DRAWINGS

FIGS. 5A to 5G are sectional partially schematic views each showing a silicon semiconductor substrate and the like for explaining a contact-hole forming method according to a sixth embodiment of the present invention;

DETAILED DESCRIPTION OF THE PREFERRED EMBODIMENTS

Hereinafter, the preferred embodiments of the present invention will be described with reference to the drawings.

Figure 1A:
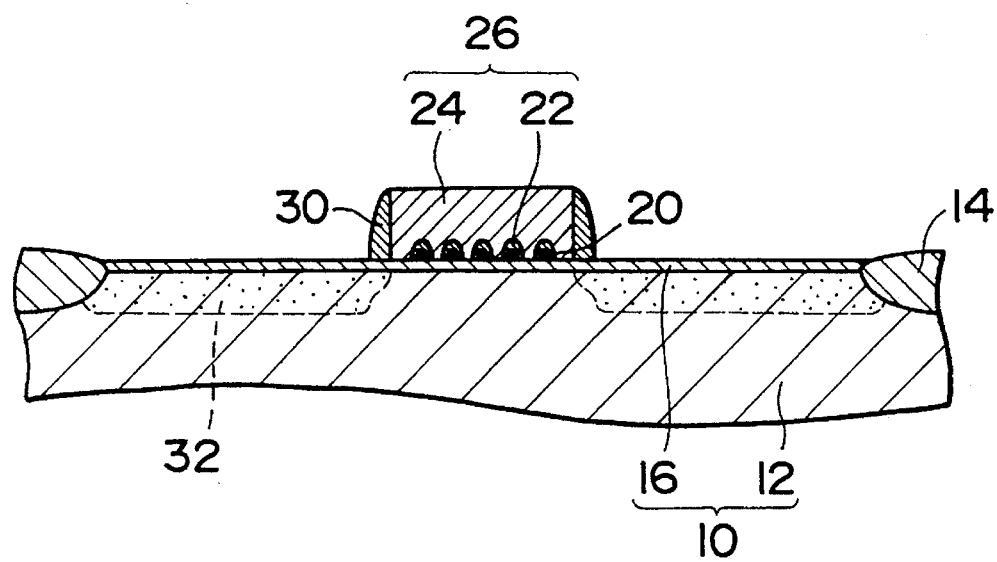
FIGS. 1A and 1B are sectional partially schematic views each showing an MOS transistor to which a complex film according to a first embodiment of the present invention is applied.
Figure 1B:
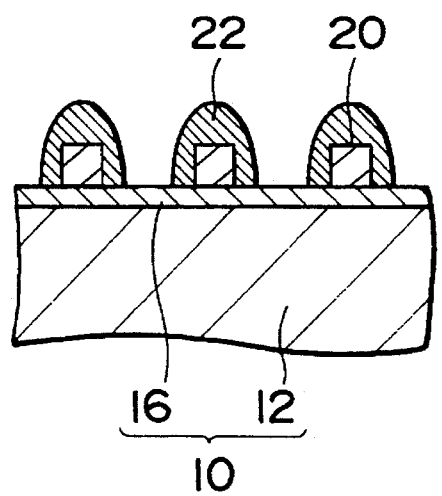

A first embodiment, in which a complex film of the present invention is applied to a gate electrode, will be described. FIG. 1A is a sectional partially schematic view of an MOS transistor. The complex film in this embodiment has island-like regions 22 formed on a substrate 10, and a thin film 24 formed of a material different from that of the island-like regions 22 to cover the substrate 10 and the island-like regions 22. The complex film (22, 24) forms a gate electrode 26 of an MOS transistor. The substrate 10 is formed of a semiconductor material, more specifically, a silicon semiconductor substrate 12 and a gate oxide film 16 formed thereon. In this figure, reference numeral 20 designates a growth nucleus. FIG. 1B is an enlarged sectional view showing the lower portion of the gate electrode 26, wherein the thin film 24 is omitted.

The island-like region 22 is made of a semiconductor material such as silicon, more specifically, silicon (polysilicon) selectively doped with a suitable impurity. On the other hand, the thin film 24 is made of silicide, specifically, tungsten silicide ($WSi_x$).

In this figure, reference numeral 14 designates a device isolation region having a LOCOS structure generally made of $SiO_2$ or $Si_3N_4$; 30 is a gate side wall; and 32 is a source/drain region.

The complex film (22, 24) or gate electrode 26 of the present invention controls the work function at the interface between the substrate 10 and the complex film (22, 24) by controlling the area of the island-like regions per unit area of the substrate 10. In addition, the work function at the interface between the substrate 10 and the complex film (22, 24) is substantially linearly changed, from the value of the work function at the interface only between the substrate 10 and the thin film 24, to the value of the work function at the interface only between the substrate 10 and each island-like region 22, with an increase in the area of the island-like regions 22 per unit area of the substrate 10.

For example, the work function is about 4.2 eV for n+-polysilicon, and 5.3 eV for p+-polysilicon. The island-like region 22 can be thus controlled to have two stable work functions by being highly doped with impurities. To form an n-type channel, phosphorus is selectively ion-implanted in the island-like region 22 which is made of polysilicon, and is grown in the form of HSG (Hemispherical Grain). On the other hand, to form a p-type channel, $BF_2+$ is selectively ion-implanted in the island-like region 22 which is made of polysilicon and is grown in the form of HSG (Hemispherical Grain). This selective ion implantation can be made by forming a resist mask on each island-like region 22 using photolithography.

The microscopic observation of the complex film (22, 24) or gate electrode 26 indicates that the island-like regions 22 made of polysilicon and the thin film made of $WSi_x$ are formed on a certain area of the substrate 10, while the thin film 24 made of only $WSi_x$ is formed on the other area of the substrate 10. In other words, the areas of the complex film having different work functions are formed on the substrate 10 in a mosaic pattern. In addition, there is known a calculation result that the work function of the complex film at the interface between the above-described areas having different work functions is changed, not in a stepwise manner, but transiently with a certain length (distance).

In the case where a size of each island-like-like region 22 made of polysilicon is sufficiently small, the whole work function of the complex film, macroscopically, becomes a specified value determined by a covering ratio of each island-like-like region 22 to the substrate 10, and by the work function of the materials forming the island-like-like region 22 and the thin film 24.

Specifically, the work function of the n-channel gate electrode is determined by the work functions of each island-like-like region 22 made of an n+-polysilicon and the thin film 24 made of $WSi_x$, and by the covering ratio of each island-like-like region 22 to the substrate 10. On the other hand, the work function of the p-channel gate electrode is determined by the work functions of each island-like-like region 22 made of P+-polysilicon and the thin film 24 made of $WSi_x$, and by the covering ratio of each island-like-like region 22 to the substrate 10.

Figure 2A:
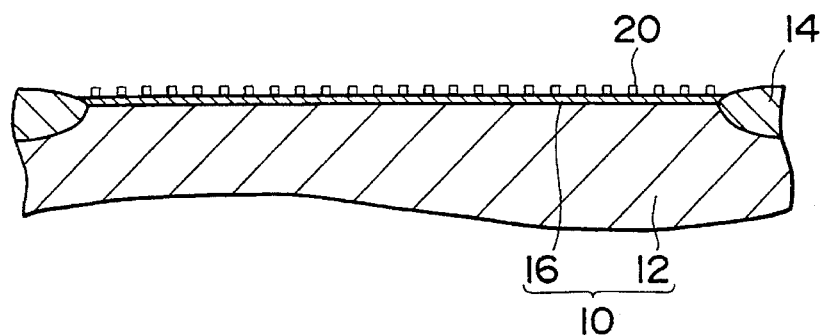
FIGS. 2A to 2C are sectional partially schematic views each showing a substrate and the like for explaining a complex film forming method and an MOS transistor fabricating method according to second and third embodiments of the present invention.

A method of forming a complex film or a method of fabricating an MOS transistor according to a second embodiment will be described with reference to FIGS. 2A to 2C.

[Process-100]

A device isolation region 14 having an LOCOS structure is formed on a silicon semiconductor substrate 12 by a usual method. The surface of the silicon semiconductor 12 is oxidized by a usual method, to form a gate oxide film 16. In this embodiment, a substrate 10 is composed of the silicon semiconductor substrate 12 having the surface formed with the gate oxide film 16.

[Process-110]

Island-like regions 22 are then formed on the substrate 10. Specifically, disilane ($Si_2H_6$) gas is flowed to the substrate 10, to form growth nuclei 20 made of polysilicon on the substrate 10 (see FIG. 2A). The formation condition for the growth nuclei 20 is, for example, as follows:

Gas used: $Si_2H_6$/13 sccm

Substrate temperature: 600° C.

Exposure time: 10–60 sec

The density of the growth nuclei 20 formed on the substrate 10 can be controlled by adjusting the time required for adjusting $Si_2H_6$ exposure time gas to the substrate 10. The density of the growth nuclei 20 may be sufficiently higher than the design rule of the semiconductor device, preferably, 40 pieces or more per unit area (1 $\mu m^2$) of the substrate 10.

Figure 2B:
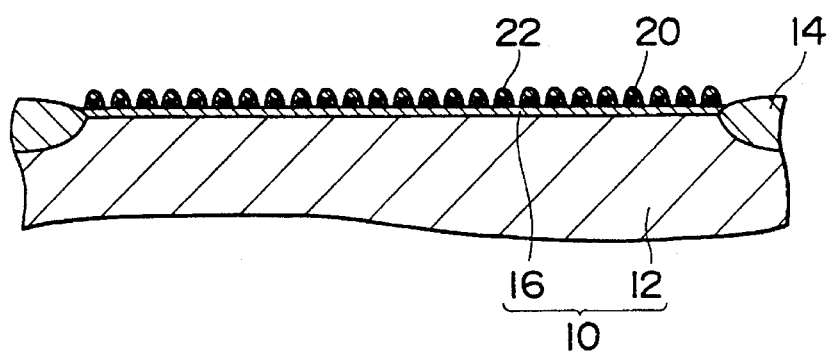

Each island-like-like region 22 made of a semiconductor material (specifically, polysilicon) is formed around each growth nucleus 20 on the substrate 10 by, for example, CVD (see FIG. 2B). The formation condition for the island-like-like region 2 is, for example as follows:

Gas used: $SiH_4$/300 sccm

Substrate temperature: 580° C.

Pressure: 0.30 Torr (40 Pa)

In such a deposition condition, polysilicon is grown only from the growth nuclei 20 in the form of HSG (Hemispherical grain). Namely, as is well known, polysilicon is grown in the form of island-likes from the initial growth to the stage of a relatively large thickness (see "Examination (2) on Growth of Hemispherical-grain (HSG) Formed on Surface of Poly-Si", Abstract of the 53-th Autumn Meeting of Applied Physics Institute, 17a-ZQ-9, 1992). Here, even when the density of the growth nuclei 20 made of polysilicon, formed in the previous process, is coarse relative to the deposited thickness of the polysilicon formed in this process, the polysilicon is formed, not to be continuous, but to be discontinuous. In other words, when the deposited thickness of the polysilicon is sufficiently thin, the generation density of the island-like-like regions 22 can be sufficiently enlarged. The covering ratio of the island-like-like regions 22 is preferably 40 pieces or more per unit area (1 $\mu m^2$) of the substrate.

In the case of forming the n-type channel, phosphorus is selectively ion-implanted in the island-like regions 2 made of polysilicon and grown in the HSG-like shape. In the case of forming a p-type channel, $BF_2+$ is ion-implanted in the island-like-like regions 2 made of polysilicon and grown in the HSG-like shape. This selective ion-implantation can be made by forming a resist mask on the island-like-like regions 22 using photolithography.

[Process-120]

Figure 2C:
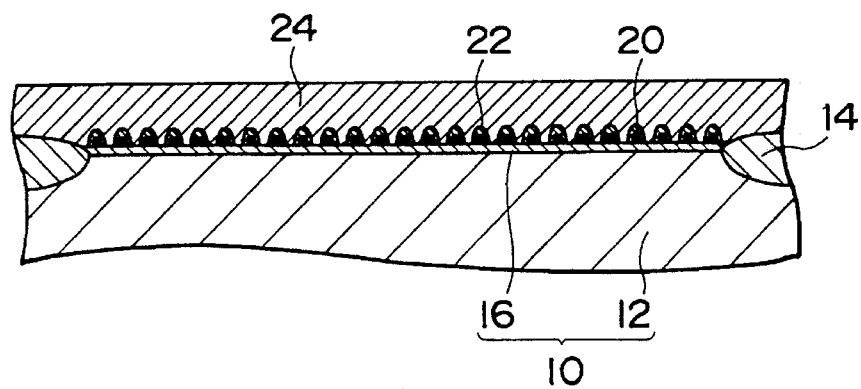

A thin film 24 is then formed for covering the substrate 10 and the island-like-like regions 22 (see FIG. 2C). The thin film 24 is made of a silicide, specifically, tungsten silicide ($WSi_x$). The deposition condition for the thin film 24 made of $WSi_x$ is, for example, as follows:

Gas used: $WF_6/SiH_2Cl_2/Ar$=2.5/150/100 sccm

Substrate temperature: 680° C.

Pressure: 0.30 Torr (40 Pa)

The thickness of the thin film 24 is dependent on the design rule of the semiconductor device such as a gate length and the sheet resistance of the required gate electrode, and for example, it is preferably in the range of from 0.05 to 0.3 $\mu m$. A complex film (22, 24) is thus formed on the substrate 10.

[Process-130]

The complex film is then patterned by a usual method using photolithography and etching. A gate electrode 26 composed of the complex film having the island-like regions 22 and the thin film 24 is thus formed.

[Process-140]

An LDD ion implantation is then made to form an LDD structure by a usual method. In general, since the selective ratio in etching between the gate electrode and a side wall is high, the side wall is formed by the deposition of $SiO_2$ or $Si_3O_4$ film and etching-back. Next, ions are implanted in the silicon semiconductor substrate 12, to form a source/drain region 32 in the silicon semiconductor substrate 12. An MOS transistor composed of the gate electrode 26 and the source/drain region 32 shown in FIGS. 1A and 1B is thus fabricated.

A third embodiment is a variant of the second embodiment. In the second embodiment, the island-like region 22 is made of polysilicon, and the thin film 24 is made of $WSi_x$. On the other hand, in the third embodiment 3, the island-like region 22 is made of a silicide (specifically, $WSi_x$), and the thin film 24 is made of a semiconductor material (specifically, polysilicon). Referring again to FIGS. 2A to 2C, the method of forming a complex film or a method of fabricating an MOS transistor according to the third embodiment will be described.

[Process-200]

Like the [Process-100] in the second embodiment, a device isolation region 14 having a LOCOS structure is formed on a silicon semiconductor substrate 12 by an usual method. The surface of the silicon semiconductor substrate 12 is oxidized by a usual method, to form a gate oxide film 16.

[Process-210]

Island-like regions 22 are formed on the substrate 10 composed of the gate oxide film 16 and of the silicon semiconductor substrate 12. Specifically, growth nuclei made of tungsten silicide ($WSi_x$) are formed by CVD using $WF_6/SiH_2Cl_2$ gas, and the island-like regions 22 made of $WSi_x$ are formed on the basis of the growth nuclei. The CVD condition is, for example, as follows.

Gas used: $WF_6/SiH_2Cl_2/Ar$=1.5/80/100 sccm

Substrate temperature: 680° C.

Pressure: 0.10 Torr (13 Pa) The density of the island-like regions 22 per unit area of the substrate 10 can be controlled by optimizing the CVD condition and the deposition condition.

[Process-220]

A thin film is formed to cover the substrate 10 and the island-like regions 22. The thin film 24 is made of polysilicon. The deposition condition of the thin film 24 made of polysilicon is, for example, as follows:

Gas: $SIH_4$/300 sccm

Substrate temperature: 550° C.

Pressure: 2.0 Torr ($2.7\times10^2$ Pa)

The thickness of the thin film 24 formed on the substrate 10 is preferably in the range of 0.03 to 0.3 μm.

[Process-230]

In the case of forming the n-type channel, phosphorous is ion-implanted in the thin film 24 made of polysilicon. In the case of forming the p-type channel, $BF_2$+ is ion-implanted in the thin film 24 made of polysilicon. This selective ion implantation can be made by forming a resist mask on the thin film 24 using photolithography. A complex film (22, 24) is thus formed on the substrate 10.

[Process-240]

The complex film (22, 24) is then patterned by a usual method using photolithography and etching, to form a gate electrode 26.

[Process-250]

Subsequently, like the [Process-140] in the second embodiment, an LDD structure and a source/drain region 32 are formed on the silicon semiconductor substrate 12, thus fabricating an MOS transistor having the gate electrode 26 and the source/drain region 32 shown in FIGS. 1A and 1B.

The thin film 24, which is made of, for example, polysilicon, can be controlled to have two stable work functions by being doped with impurities in high concentrations. From a microscopic observation, the island-like regions 22 made of $WSi_x$ and the thin film 24 made of polysilicon are formed on a certain area of the substrate 10. On the other hand, only the thin film 24 made of polysilicon is formed on the other area of the substrate 10. Namely, the areas of the complex film having different work functions are formed on the substrate 10 in a mosaic pattern, like the first embodiment.

When the size of each island-like region 22 made of $WSi_x$ is sufficiently small, the work function of the whole complex film macroscopically becomes a specified value determined by the covering ratio of the island-like regions 22 to the substrate 10, and the work functions of materials forming the island-like region 22 and the thin film 24. Namely, the work function in the n-type channel gate electrode is determined by the work functions of the island-like region 22 made of $WSi_x$ and the thin film 24 made of n+-polysilicon, and by the covering ratio of the island-like regions 22 to the substrate 10. On the other hand, the work function in the p-type channel gate electrode is determined by the work functions of the island-like region 22 made of $WSi_x$ and the thin film 24 made of p+-polysilicon, and by the covering ratio of the island-like regions 22 to the substrate 10. On other words, the work function at the interface between the substrate 10 and the complex film (22, 24) is substantially linearly changed, from the value of the work function at the interface only between the substrate 10 and the thin film 24, to the value of the work function at the interface only between the substrate 10 and each island-like region 22, with an increase in the area (that is, covering ratio) of the island-like regions 22 per unit area of the substrate 10.

A fourth embodiment will be described, in which a complex film of the present invention is applied to an interconnect structure, and specifically, it is applied as a metallization material for achieving an ohmic contact. By applying the complex film of the present invention to a contact-hole, it becomes possible to lower the barrier height for both the n-type channel and p-type channel, and to reduce the contact resistance.

Figure 3A:
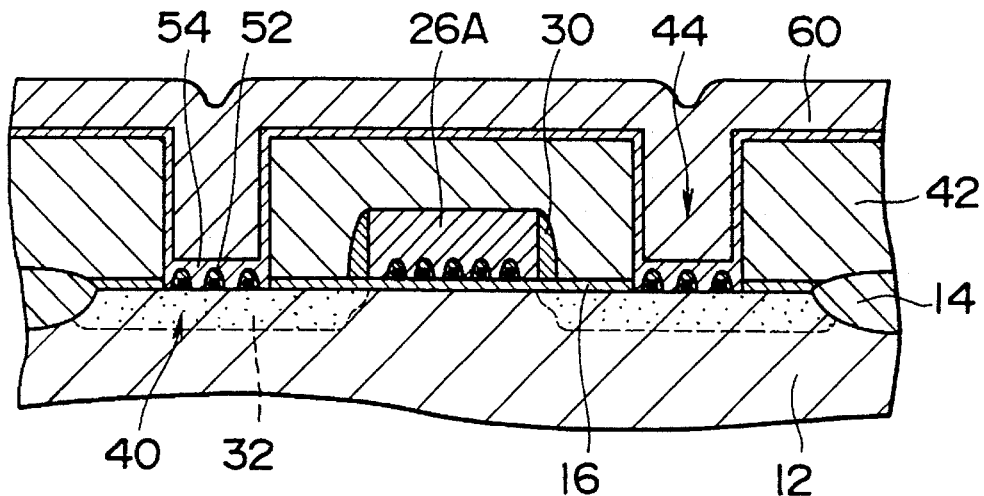
FIGS. 3A and 3B are sectional partially schematic views each showing an interconnect structure having a contact-hole including a complex film of a fourth embodiment of the present invention.
Figure 3B:
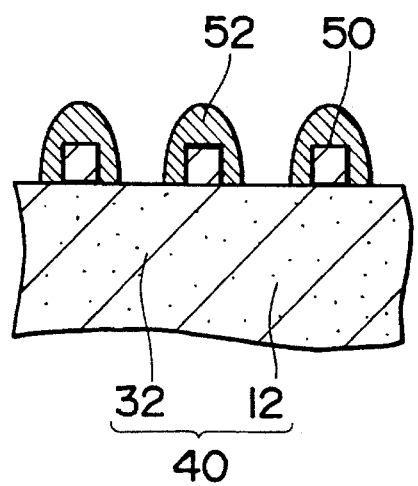

The interconnect structure of the fourth embodiment includes a contact-hole having a complex film on the bottom portion. FIG. 3A is a sectional partially schematic view of the interconnect structure; and FIG. 3B is an enlarged partially sectional view of the bottom portion of the contact-hole. The complex film of the fourth embodiment includes island-like regions 52 formed on a substrate 40, and a thin film 54 which is formed of a material different from that of the island-like region 52 for covering the substrate 40 and the island-like regions 52. The substrate 40 is made of a semiconductor material, specifically, a silicon semiconductor substrate 12 formed with a source/drain region 32. The island-like region 52 is made of a semiconductor material (specifically, polysilicon), and the thin film 54 is made of titanium (Ti). In FIGS. 3A and 3B, reference numeral 14 designates a device isolation region having a LOCOS structure; 16 is a gate oxide film, 26A is a gate electrode; 30 is a gate side wall made of polysilicon; 42 is an insulating interlayer made of $SiO_2$; 44 is an opening provided in the insulating interlayer 42; and 60 is a metallization material layer.

In the complex film or the interconnect structure of the present invention, the work function at the interface between the substrate 40 and the complex film (52, 54) is controlled by adjusting the area of the island-like regions 52 per unit area of the substrate 40. Specifically, the work function at the interface between the substrate 40 and the complex film (52, 54) is substantially linearly changed, from the value of the work function at the interface only between the substrate 40 and the thin film 54, to the value of the work function at the interface only between the substrate 40 and each island-like region 52, with an increase in the area of the island-like regions 52 per unit area of the substrate 40.

In the complex film (52, 54) or the bottom portion of the contact-hole, from the microscopic observation, the thin film 54 including the island-like regions 52 made of polysilicon and Ti is formed on a certain area of the substrate 40. On the other hand, the thin film only including Ti is formed on the other area of the substrate 40. Namely, the areas of the complex film having different work functions are formed on the substrate 40 at the bottom portion of the opening 44 in a mosaic pattern.

When the size of each island-like region 52 made of polysilicon is sufficiently small, the work function of the complex film macroscopically becomes a specified value determined by the covering ratio of the island-like regions 52 to the substrate 40 and by the work functions of the materials forming the island-like region 52 and the thin film 54.

In the case of forming the n-type channel, the island-like region 52 is formed of n+-polysilicon. On the other hand, in the case of forming the p-type channel, the island-like region 52 is formed of p+-polysilicon.

Accordingly, the work function in the n-type channel is determined by the work functions of the island-like region 52 made of n+-polysilicon and the thin film 54 made of Ti, and by the covering ratio of the island-like regions 52 to the substrate 40. The work function in the p-type channel is determined by the work functions of the island-like region 52 made of p+-polysilicon and the thin film 54 made of Ti, and by the covering ratio of the island-like regions 52 to the substrate 40.

Thus, by applying the complex film of the present invention to the bottom portion of the contact-hole, it becomes possible to lower the barrier height for both the n-type channel and p-type channel, and to reduce the contact resistance.

Figure 4A:
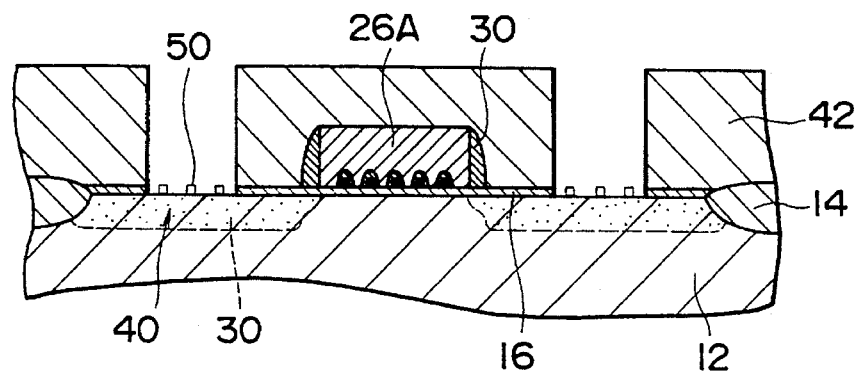
FIGS. 4A to 4C are sectional partially schematic views each showing a substrate and the like for explaining a complex film forming method and an interconnect structure forming method according to a fifth embodiment of the present invention.

A method of forming a complex film or a method of fabricating an interconnect structure according to a fifth embodiment of the present invention will be described with reference to FIGS. 4A to 4C.

[Process-300]

Like the [Process-100] of the second embodiment, a device isolation region 14 having a LOCOS structure is formed on a silicon semiconductor substrate 12 by a usual method. The surface of the silicon semiconductor substrate 12 is oxidized, to form a gate oxide film 16. After that, a gate electrode 26A is formed by a usual method or the method described in the second or third embodiment, and then a gate side wall 30 and a source/drain region 32 are formed. An insulating interlayer 42 made of $SiO_2$ is formed over the whole surface by CVD or the like. An opening 44 is formed on the insulating interlayer 42 over the source/drain region 32 by photolithography and etching. In the fifth embodiment, the substrate 40 is formed of the silicon semiconductor substrate 12 formed with the source/drain region 32.

After that, a complex film, in which the work function at the interface with silicon of the source/drain region 32 in the substrate 40, is for example formed as follows:

[Process-310]

Island-like regions 52 are formed on the substrate 40 exposed from the bottom portion of the opening 44. Specifically, disilane ($Si_2H_6$) gas is flowed to the substrate 40, and growth nuclei 40 made of polysilicon are formed (see FIG. 4A). The formation condition of the growth nuclei 50 is, for example, as follows:

Gas used: $Si_2H_{6/13}$ sccm

Substrate temperature: 600° C.

Emitting time: 10–60 sec

The density of growth nuclei 50 formed on the substrate 40 can be controlled by adjusting the emitting time of $Si_2H_6$ gas. The density of the growth nuclei 50 may be sufficiently higher than the designed rule of the semiconductor device, for example, 10 pieces or more for the contact-hole (0.5 μm×0.5 μm=0.25 μm²), that is, 40 pieces or more per unit area (1 μm²) of the substrate 40.

Figure 4B:
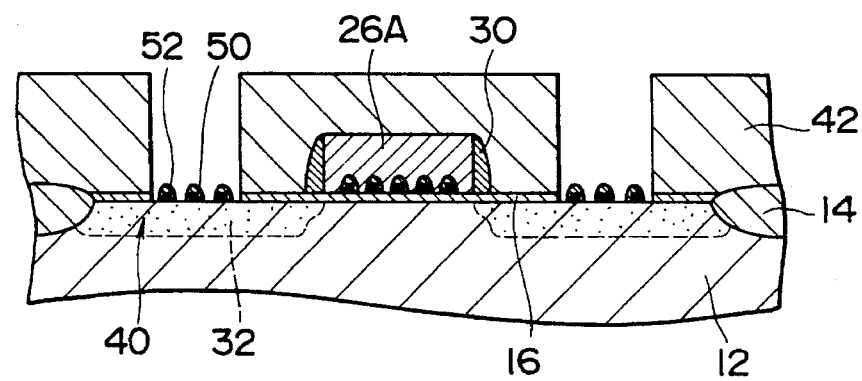
Figure 4C:
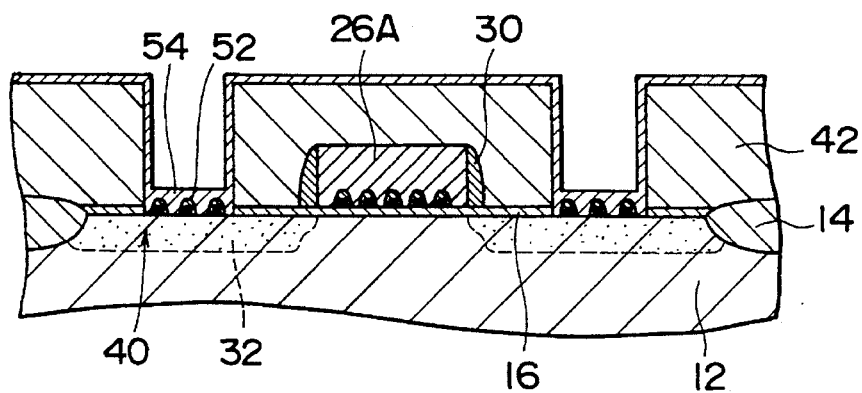

Island-like regions 52 made of polysilicon are formed on the substrate 40 around the growth nuclei 50 (see FIG. 4B). The formation condition of the island-like region 52 is, for example, as follows:

Gas used: $SiH_4$/300 sccm

Substrate temperature: 580° C.

Pressure: 0.30 Torr (40 Pa)

In such a deposition condition, polysilicon is grown in the form of HSG only from the growth nuclei 50. Namely, the polysilicon is grown not in a continuous film but in an island-like shape from the initial growth to the stage of a relatively large thickness. Here, when the density of the growth nuclei 20 made of polysilicon which are formed in the previous process is coarse relative to the deposited thickness of the polysilicon formed in this process, the polysilicon becomes, not a continuous film, but the island-like shape. The covering ratio of the island-like regions 22 to the substrate 40 is preferably 40 pieces or more per unit area (1 μm²) of the substrate 40.

In the case of forming the n-type channel, phosphorus is selectively ion-implanted in the island-like regions 52 made of polysilicon and grown in the form of HSG. In the case of forming the p-type channel, $BF_2$+ is ion-implanted in the island-like regions 52 made of polysilicon and grown in the form of HSG. This selective ion-implantation can be made by forming a resist mask using photolithography. After that, the thermal-treatment is made for activation. The island-like regions 52 made of polysilicon are formed on the substrate 40 exposed from the bottom portion of the opening 44.

[Process-320]

After that, a thin film 54 is formed. The thin film 54 is formed of titanium (Ti) by, for example, sputtering (see FIG. 4C). The deposition condition of the thin film 54 is for example as follows: In addition, the thin film 54 covers not only the island-like regions 52 and the substrate 40 exposed from the bottom portion of the opening 44, but also the side wall of the opening 44 and the surface of the insulating interlayer 42.

Target: Ti
Process gas: Ar=100 sccm
DC power: 4 kW
Pressure: 0.4 Pa
Substrate temperature: 150° C.
Film thickness: 30 nm

[Process-330]

A barrier metal layer (not shown) made of TiN is formed on the thin film 54 made of Ti by sputtering. The deposition condition for the barrier metal layer is, for example, as follows: The barrier metal layer functions to prevent a metallization material formed in the subsequent process from projecting to the source/drain region 32.

Target: Ti
Process gas: Ar/N$_2$=30/70 sccm
DC power: 5 kW
Pressure: 0.4 Pa
Substrate temperature: 150° C.
Film thickness: 60 nm

[Process-340]

After that, a metallization material layer 60 made of an aluminum alloy such as Al—Si—Cu is deposited on the entire surface, including the interior of the opening 44, by sputtering. The film deposition of the metallization material layer 60 is made by a high temperature aluminum sputtering method under the following condition:

Process gas: Ar=100 sccm
DC power: 10 kW
Sputtering pressure: 0.4 Pa
Substrate heating temperature: 500° C.
Film deposition rate: 600 nm/min An upper interconnect layer made of the metallization material layer 60 is formed on the insulating interlayer 42, and the metallization material layer is embedded in the opening 44, to thus form a contact-hole electrically connecting the source/drain region 32 to the upper interconnect layer.

In the [Process-340], the high temperature aluminum sputtering method may be replaced by an aluminum reflow method. In this case, a metallization layer 60 made of an aluminum alloy is deposited on the entire surface including the interior of the opening 44 by sputtering at a substrate temperature of about 150° C. After that, the substrate 40 is heated at about 500° C. The metallization material layer 60 deposited on the insulating interlayer 42 is thus made to reflow, and it flows in the opening 44. The opening 44 is thus filled with the metallization material layer 60.

In the [Process-340], by a blanket tungsten CVD method replaced with the above sputtering method, the opening 44 may be filled with a metal plug made of tungsten. The condition of the blanket tungsten CVD method is, for example, as follows: In addition, the tungsten layer covers not only the island-like regions and the substrate 40 exposed from the bottom portion of the opening 44, but also the interior of the opening and on the surface of the insulating interlayer 42.

First step (nuclei forming stage)
WF$_6$/SiH$_4$/Ar=5/3/2000 sccm
Pressure: 4×10$^2$ Pa (3 Torr)
Temperature: 450° C.
Second step (high rate growing stage)
WF$_6$/H$_2$/Ar=40/400/2250 sccm
Pressure: 1.1×10$^4$ Pa (80 Torr)
Temperature: 450° C.

The tungsten layer is then etched-back to remove the tungsten layer formed on the insulating interlayer 42, so that the metal plug made of tungsten remains in the opening 44. After that, like the [Process-340], a metallization material layer made of Al—Si—Cu is deposited over the whole surface by sputtering. An upper interconnect layer made of the metallization material layer is formed on the insulating interlayer 42, and the metal plug made of tungsten is embedded in the opening, thus forming a contact-hole electrically connecting the source/drain region 32 to the upper interconnect layer. In addition, the metallization material layer may be deposited on the whole surface of the tungsten layer by sputtering without etching-back of the tungsten layer, after which the metallization material layer and the tungsten layer may be removed.

Alternatively, the opening 44 may be embedded with a metal plug made of tungsten by the so-called selective tungsten CVD method. The condition of this CVD is for example as follows:

Gas: WH$_6$/SiH$_4$/H$_2$/Ar=10/7/1000/10 sccm
Temperature: 260° C.
Pressure: 26 Pa Although the present invention has been described by way of the preferred embodiments, it is not limited thereto. The conditions shown in the embodiments are only illustrative, and may be suitably changed. In the embodiments, the base body is formed of the silicon semiconductor substrate; however, it may be constituted of an SOI structure.

The material forming a thin film or island-like region for a gate electrode may include a refractory metal silicide such as MoSi$_x$, TiSix or TaSi$_x$, other than WSi$_x$. On the other hand, the material forming an island-like region or a thin film may include germanium, carbon or compounds thereof (for example, SiGe, SiC and the like), other than silicon. An island-like region may be also formed of a silicide, and a thin film may be formed of the other silicide.

The material forming an island-like region for an interconnect structure may include a germanium, carbon and the compound thereof (for example, SiGe, SiC and the like), other than silicon. On the other hand, the material forming a thin film may include TiN, and W formed by selective tungsten CVD, other than Ti. The thin film made of Ti may be also formed by CVD.

By selectively forming island-like regions made of semiconductors (Ge and C) different in band gap in place of silicon on a substrate, it becomes possible to control different work functions on various regions of one substrate, and hence to eliminate the necessity of doping of impurities.

In each of the embodiments, to obtain different work functions in the n-type channel and p-type channel, the semiconductor material is doped with impurities. However, in place of such a doping, there may be used a method of making different the density of island-like regions 22 (52) between the n+-Si surface and p+-Si surface. A metal (for example, tungsten), which is easy to grow on the surface of n+-Si and difficult to grow on the surface of p+-Si, and which is low in barrier height against n+-Si, is formed on the substrate 10 (40) by CVD. The island-like regions 22 (52) are thus formed only on the surface of n+-Si. After that, a thin film 24 (54) made of a metal (for example, Pt) having a low barrier height against P+-Si is deposited on the whole surface of the substrate by CVD or sputtering. The island-like regions 22 (52) and the thin film 24 (54) are thus formed only on the surface of n+-Si; and the thin film 24 (54) is formed on the surface of P+-Si. As a result, the work function is made different in the n-type channel and p-type channel. In this case, there is not required the step of forming growth nuclei using $Si_2H_6$ gas, that is, the formation of the island-like regions is changed using the difference in the characteristic of the surface of the substrate.

Similarly, a metal, which is easy to grow on the surface of P+-Si and difficult to grow on the surface of n+-Si and which is low in barrier height against p+-Si, is formed on the substrate 10 (40) by CVD. A thin film 24 (54) made of a metal having low barrier height against n+-Si is formed on the substrate by CVD. The island-like regions 22 (52) and the thin film 24 (54) are formed on the surface of p+-Si; and the thin film 24 (54) is formed on the surface of n+-Si. As a result, the work function is made different in the n-type channel and the p-type channel.

Moreover, the island-like region and the thin film may be formed by different materials. In this case, the interface between the different work functions cannot be formed on one substrate; however, the range of the work function controlled by the selection of the material can be extended. The doping is also not required in this case.

In the case of forming an interconnect structure, the insulating interlayer may include the known insulating material such as BPSG, PSG, BSG, AsSG, PbSG, SbSG, SOG, SiON or SiN, or the dielectric stack thereof, other than $SiO_2$. The aluminum alloy in the embodiment may include pure aluminum and an aluminum alloy such as Al—Si, Al—Cu, and Al—Ge. The substrate may include an Si based semiconductor such as SOI and a compound semiconductor such as GaAs.

In a complex film or a gate electrode of the present invention, it becomes possible to control the work function of the gate electrode, and hence to control the threshold value $V_{th}$ irrespective of the concentration of impurity in the channel region. Moreover, by forming island-like regions (thin film) of a semiconductor material, changing the covering ratio of the island-like regions to the substrate, and selectively introducing an impurity to the island-like regions (thin film) using a resist mask, the work function can be controlled dependently in the n-type channel and the p-type channel.

In a complex film or interconnect structure, since the work function, which has been determined only by the kind of the material, can be controlled, the contact resistance can be reduced. Moreover, by forming island-like regions of a semiconductor material, changing the covering ratio of the island-like regions to the substrate, and selectively introducing an impurity to the island-like regions using a resist mask, the barrier height can be controlled dependently in the n-type channel and p-type channel. As a result, the resistance of the contact-hole can be simultaneously reduced in the n-type channel and p-type channel.

The range controlling the work function can be extended by the combination of the materials forming the island-like region and the thin film.

Next, a method of forming a contact-hole of a semiconductor element according to a sixth embodiment will be described with reference to FIGS. 5A to 5G, and FIG. 6. In this embodiment, a metal layer is formed of titanium (Ti) by sputtering.

First, a source/drain region 80 is formed on a silicon semiconductor substrate 70 by a usual method. Prior to this process, a device isolation region 71 having a LOCOS structure is formed on the silicon semiconductor substrate 70, and a gate oxide film 72 is formed on the surface of the silicon semiconductor substrate 70. A polysilicon layer 73 and a $WSi_2$ layer 74 are formed, and are patterned to form a gate electrode 75 (see FIG. 5A). After that, to form an LDD structure, the whole surface is subjected to ion-implantation. A $SiO_2$ layer is then formed over the whole surface, and is etched-back to form a gate side wall 76 made of $SiO_2$. Next, a mask (not shown) for ion-implantation is formed and an n-type impurity (for example, arsenic or phosphorous) is ion-implanted in a portion, to be formed with a source/drain region of an n-channel transistor, of the silicon semiconductor substrate, and a p-type impurity (for example, boron) is ion-implanted in a portion, to be formed with a source/drain region of a p-channel transistor, of the silicon semiconductor substrate. The structure shown in FIG. 5B can thus be obtained.

[Process-410]

An insulating layer 81 made of $SiO_2$ is formed over the whole surface by CVD. An opening 82 is formed in the insulating layer 81 over the source/drain region 80 by photolithography and dry etching (see FIG. 5C).

[Process-420]

A metal layer 83 is formed at least in the interior of the opening 82. In this embodiment, the metal layer made of Ti is formed on the insulating layer 81, including the interior of the opening 83 by sputtering. The film deposition condition is, for example, as follows:

Process gas: Ar=100 sccm
DC power: 5 kW
Pressure: 0.4 Pa
Substrate heating temperature: 200° C.
Film thickness: 30 nm

[Process-430]

A capping layer 84 made of TiN is formed on the metal layer 83 by sputtering (see FIG. 5D). In addition, the close capping layer 84 has a function for suppressing the out-diffusion of the impurity upon heating in the subsequent [Process-450]. The film deposition condition of the closely capping layer 84 is for example as follows:

Process gas: $N_2$/Ar=80/30 sccm
DC power: 5 kW
Pressure: 0.4 Pa
Substrate heating temperature: 200° C.
Film thickness: 100 nm

[Process-440]

Figure 5E:
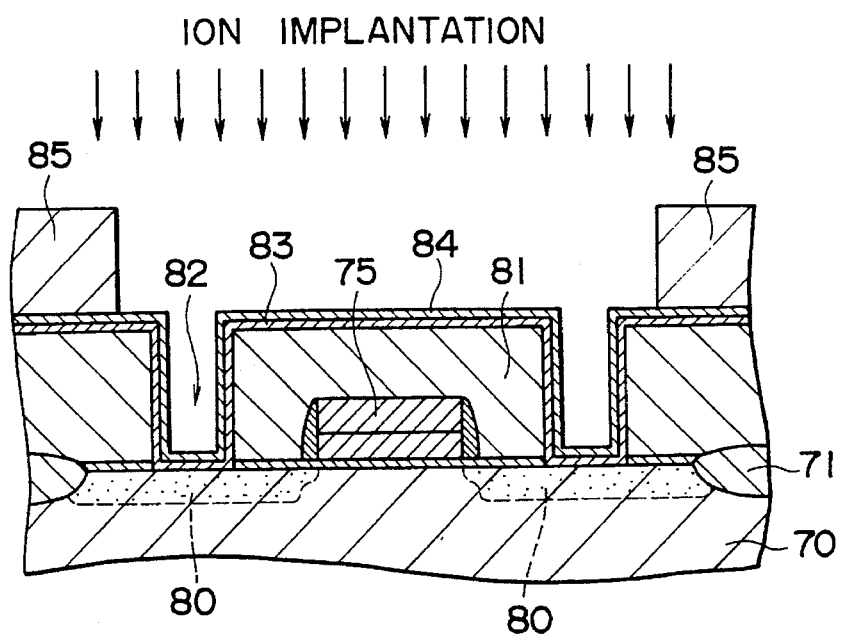
Figure 5F:
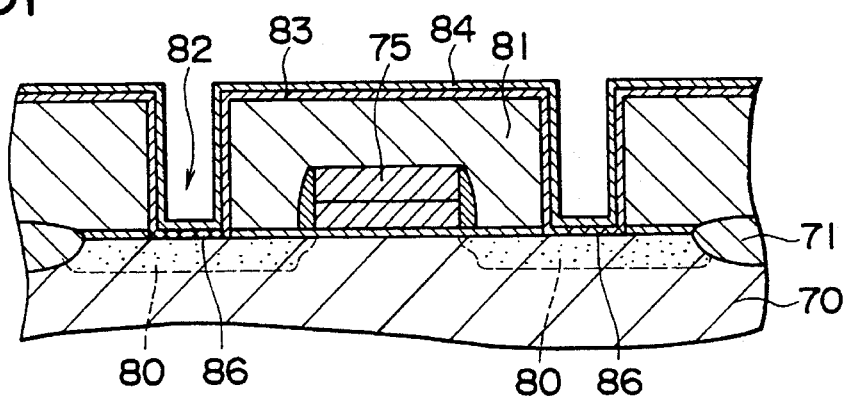

Impurities are ion-implanted in the metal layer 83 (see FIG. 5E). A mask 85 for ion-implantation is formed, and an n-type impurity (for example, arsenic or phosphorous) is ion-implanted in the metal layer in the opening formed over the source/drain region of the n-channel transistor, and a p-type impurity (for example, boron) is ion-implanted in the metal layer in the opening formed over the source/drain region of the p-channel transistor. In addition, the ion-implantation condition is determined such that the projected range corresponds to the position of the metal layer 83 as exactly as possible. The dose of the impurity is set at, for example, $5\times10^{15}/cm^2$. In the case where the contact resistance of either of the devices is reduced, either type of the impurities may be ion-implanted.

[Process-450]

Figure 6:
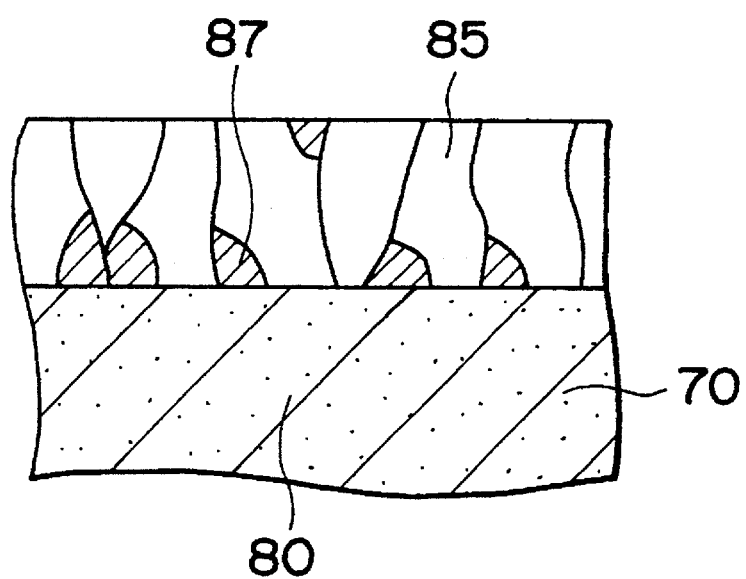
FIG. 6 is a schematic view showing silicon crystal grains precipitated in a metal silicide layer.

The silicon semiconductor substrate 70 is then heated, and thereby the metal (Ti, in this embodiment) forming the metal layer 83 on the bottom portion of the opening 82 reacts with silicon forming the silicon semiconductor substrate 70, to form a metal silicide layer 86 (TiSi$_x$, in this embodiment) on the bottom portion of the opening 82 (see FIG. 5F), and to precipitate silicon crystal grains 87 in the metal silicide layer 86 at and near the interface with the source/drain region on the bottom portion of the opening 82. FIG. 6 is an enlarged sectional view of the bottom portion of the opening 82 typically showing this state. As the thermal treatment condition, there can be used RTA (Rapid Thermal Annealing) which is made in a nitrogen gas atmosphere at 600° C. for 30 sec. Next, the thermal treatment is made in a nitrogen atmosphere at 850° C. for 30 min, to activate the impurity implanted and entrapped in the silicon crystal grains 87.

The silicon crystal grains are precipitated in the metal silicide layer 86 formed on the bottom portion of the opening 82 and the metal silicide layer 86 at and near the interface with the silicon semiconductor substrate 70, as a result of which a metal silicide layer rich in silicon is formed. In such a metal silicide layer rich in silicon, the work function is controlled by the impurity selectively introduced, so that the barrier height $\phi_b$ between each of the metal silicide layers 86 in the n-channel transistor and p-channel transistor and the silicon semiconductor substrate 70, can be controlled to be smaller. In addition, the composition of the metal silicide layer 86 in the area separated from the interface is substantially TiSi$_2$.

[Process-460]

A metallization material 88 is deposited at least in the interior of the opening 82. In the sixth embodiment, W is used as the metallization material 88. The deposition of the metallization material 88 may be made by the so-called blanket tungsten CVD method under the following condition.

Gas used: WF$_6$/H$_2$/Ar=80/500/2800 sccm

Film formation temperature: 450° C.

Pressure: $1.1\times10^4$ Pa

Film thickness: 0.5 μm

The metallization material 88 made of tungsten is thus filled into the opening 82 formed in the insulating layer 81, to form a contact-hole. On the other hand, the tungsten layer is also formed on the insulating layer 81. In addition, after film formation, the tungsten layer may be etched-back over the whole surface, as needed. The etching-back condition is for example as follows:

Gas used: SF$_6$/Ar=110/90 sccm

Pressure: 35 Pa

RF power: 275 W

[Process-470]

An aluminum alloy layer 89 is formed on the insulating layer 81 (or on the tungsten layer) by sputtering. The deposition condition of the aluminum alloy layer 89 is for example as follows:

Process gas: Ar=100 sccm

DC power: 10 kW

Pressure: 0.4 Pa

Substrate heating temperature: 150° C.

Film thickness: 0.3 μm

Figure 5G:
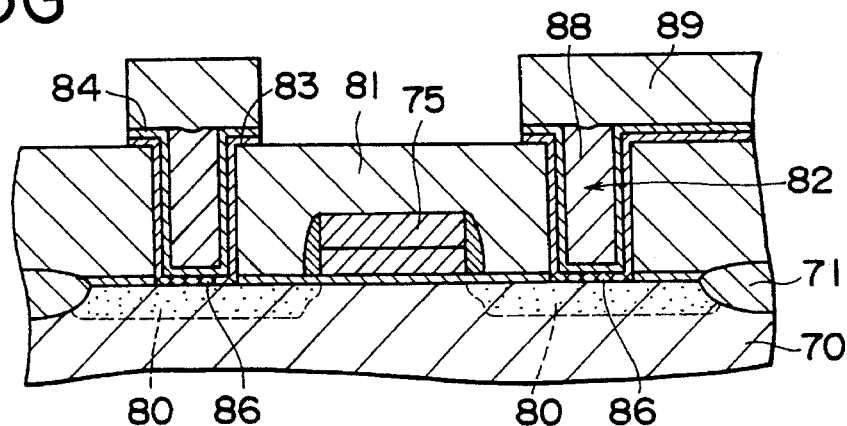

The aluminum alloy layer 89 is patterned in a desired shape using photolithography and dry etching, to complete the interconnection (FIG. 5G).

Thus, there can be formed the contact-hole of the present invention which includes the metal silicide layer 86 formed at least on the bottom portion of the contact-hole, and the metallization material 88 formed on the metal silicide layer 86, wherein the silicon crystal grains 87 containing to a great extent the impurity having the same conducting type as that of the source/drain region, are formed at and near the interface with the source/drain region 80. In the contact-hole of the sixth embodiment, the work function of the metal silicide layer at the interface between the source/drain region and the metal silicide layer is mainly controlled by the concentration of the impurity contained in the silicon crystal grains, though it is dependent on the thermal treatment condition of the silicon semiconductor substrate 70.

A seventh embodiment concerning a method of forming a contact-hole of a semiconductor element will be described with reference to FIGS. 7A to 7C. In this embodiment, a metal silicide, specifically, tungsten silicide (WSi$_x$) is, formed on a silicon semiconductor substrate by CVD.

[Process-500]

A source/drain region 110 is formed on a substrate 100A made of silicon semiconductor by a usual method, and an insulating layer 111 is formed over the whole surface. An opening 112 is then formed in the insulating layer 111 over the source/drain region 110. This process is the same as in the [Process-400] and [Process-410].

[Process-510]

Next, a silicon rich metal silicide layer 120 is formed at least in the opening 112. In the seventh embodiment, a metal silicide layer 120 is made of WSi$_x$. The condition of the CVD is for example as follows:

Gas used: SiH$_2$Cl$_2$/WF$_6$/Ar=300/2.5/100 sccm

Film formation temperature: 680° C.

Pressure: 40 Pa

Film thickness: 50 nm

In the sixth embodiment, the metal layer 83 reacts with silicon to form the metal silicide layer 86. On the contrary, in the seventh embodiment, the silicon rich metal silicide 120 is formed. Accordingly, the composition of the metal silicide layer 120 can be freely controlled as compared with the sixth embodiment. Namely, a large amount of the silicon crystal grains can be precipitated in the metal silicide layer at and near the interface with the source/drain region on the bottom portion of the opening. As a result, as compared with the sixth embodiment, the work function can be easily and accurately controlled, or suitably selected from the wide range.

[Process-520]

Figure 7A:
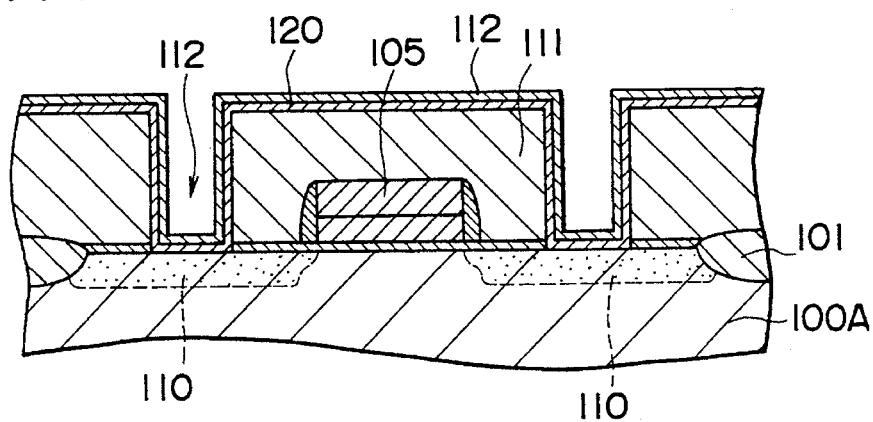
FIGS. 7A to 7C are sectional partially schematic views each showing a silicon semiconductor substrate and the like for explaining a contact-hole forming method according to a seventh embodiment of the present invention.

After that, in the same manner as in the [Process-430] of the sixth embodiment, a capping layer 114 made of TiN is formed on the metal silicide layer 120 by sputtering (see FIG. 7A).

[Process-530]

Figure 7B:
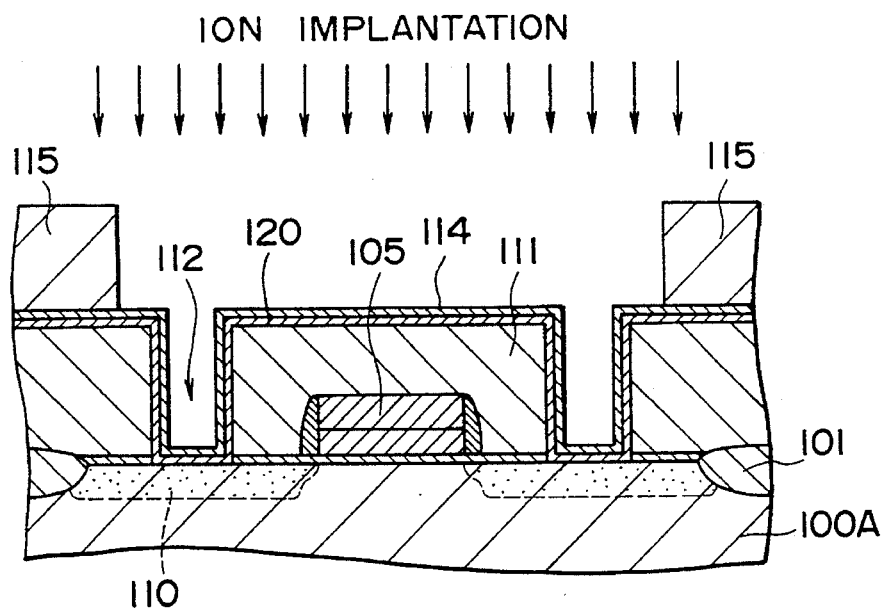
Figure 7C:
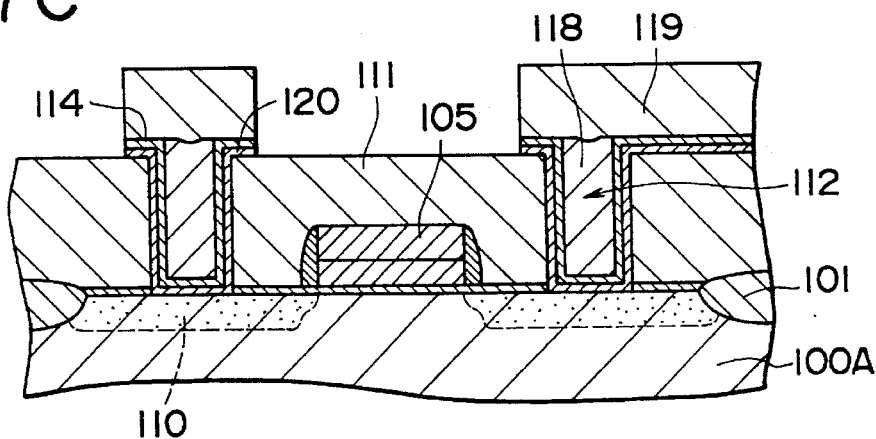

Impurities are ion-implanted in the metal silicide layer 120 (see FIG. 7B). First, a mask 115 for ion-implantation is formed, and an n-type impurity (for example, arsenic or phosphorus) is implanted in the metal silicide layer 120 in the opening formed on the source/drain region of the n-channel transistor, and a p-type impurity (for example, boron) is ion-implanted in the metal silicide layer 120 in the opening formed on the source/drain region of the p-channel transistor. In addition, the ion-implantation condition is selected such that the ion flight corresponds to the position of the metal silicide layer 120 as exactly as possible. The dose of the impurity is set at, e.g., about $5 \times 10^{15}/cm^2$. In the case where the contact resistance of either device is reduced, either of the type of impurities may be ion-implanted.

[Process-540]

The substrate 100A is heated, and thereby silicon crystal grains are precipitated in the metal silicide layer 120 at and near the interface with the source/drain region on the bottom portion of the opening 112, and the impurity ion-implanted and precipitated in the silicon crystal grains are activated. In the seventh embodiment, since $WSi_x$ is superior to $TiSi_x$ in heat-resistance is used as the metal silicide layer 120, the thermal treatment may be performed at a high temperature. The condition of the thermal treatment is made by RTA (1000° C.×30 sec) in a nitrogen atmosphere.

The silicon crystal grains are precipitated in the metal silicide layer 120 at and near the interface between the metal silicide layer 120 formed on the bottom portion of the opening 12 and the substrate 100A, as a result of which a silicon rich metal silicide layer is formed. In the silicon rich metal silicide layer, the work function is controlled by the impurity selectively introduced, and the barrier height $\phi_b$ between the metal silicide layer 120 in each of the n-channel and p-channel devices and the substrate 100A can be controlled to be smaller. In addition, the composition of the metal silicide layer 120 separated from the interface, after thermal treatment, is substantially $WSi_2$.

[Process-550]

A metallization material 118 is deposited at least in the opening 112. In the seventh embodiment, tungsten (W) is used as the metallization material 118. The deposition of the metallization material 118 is performed by the blanket tungsten CVD method as in the [Process-460] in the sixth embodiment. The metallization material 118 made of tungsten is thus filled into the opening 112 formed in the insulating layer 111, to form a contact-hole. After that, in the same manner as in the [Process-470] in the sixth embodiment, an aluminum alloy layer 119 is formed on the insulating layer 111 (or on the tungsten layer) by sputtering, and is patterned in a desired shape by photolithography and dry etching, thus completing the interconnection (see FIG. 7C).

Thus, there can be formed the contact-hole of the present invention including the metal silicide layer 120 formed at least on the bottom portion of the contact-hole and the metallization material 118 formed on the metal silicide layer 120, wherein the silicon crystal grains containing to a large extent the impurity having the conducting type as that of the source/drain region are formed in the metal silicide layer at and near the interface with the source/drain region 110. In the contact-hole of the seventh embodiment, the work function of the metal silicide layer at the interface between the source/drain region and the metal silicide layer is controlled, by the ratio between the total area of the silicide crystal grains in the metal silicide layer at the interface with the source/drain region and the total area of the silicon crystal grains in the metal silicide layer at the interface with the source/drain region, and by the concentration of the impurity contained in the silicon crystal grains. In addition, the ratio between the total area of the metal silicide crystal grains and the precipitated silicon crystal grains is controlled by the forming condition of the metal silicide layer 120 and the heating condition of the substrate 100A.

Although the present invention has been described by way of the preferred embodiments, it is not limited thereto. The conditions and the values in the embodiments are only illustrative, and they may be suitably changed. Moreover, the deposition method for each layer may be variously changed in the combination thereof.

In the sixth embodiment, the metal layer made of Ti may be formed by CVD. The deposition condition of the metal layer 83 made of Ti by CVD is, for example, as follows:

Gas used: $TiCl_4/H_2/Ar=15/50/43$ sccm

Microwave power: 2.0 kW

Temperature: 420° C.

Pressure: 0.3 Pa

The closely contacting layer 84 made of TiN may be formed by CVD. The deposition condition of the TiN layer by ECR CVD is, for example, as follows:

Gas used: $TiCl_4/H_2/N_2/Ar=20/26/8/43$ sccm

Microwave power: 2.8 kW

Substrate RF bias: 50 W

Temperature: 420° C.

Pressure: 0.23 Pa

In the method of forming a contact-hole according to the present invention, in place of the metal layer made of Ti, there may be used a metal layer made of tungsten (W), molybdenum (Mo), tantalum (Ta), vanadium (V), chromium (Cr), cobalt (Co), nickel (Ni), zirconium (Zr), niobium (Nb), rhodium (Rh), palladium (Pd), hafnium (Hf), platinum (Pt), manganese (Mn), iron (Fe), iridium (Ir), ruthenium (Ru), osmium (Os) or rhenium (Re), which is formed by the physical vapor-phase growth method such as sputtering or deposition, or the chemical vapor-phase growth method such as CVD. As for Ti, W, Mo, Ta, Pt, Re and the like, a source gas composed of the halogen compound thereof is reduced by $H_2$ or the like using CVD, to form a metal film. In some case, the organic metal compound thereof can be used to form a metal layer by CVD.

In the method of forming a contact-hole of the present invention, in place of the metal silicide layer made of $WSi_x$, there may be used a metal silicide layer made of silicon and a metal such as titanium (Ti), molybdenum (Mo), tantalum (Ta), vanadium (V), chromium (Cr), cobalt (Co), nickel (Ni), zirconium (Zr), niobium (Nb), rhodium (Rh), palladium (Pd), hafnium (Hf), platinum (Pt), manganese (Mn), iron (Fe), iridium (Ir), ruthenium (Ru), osmium (Os) or rhenium (Re), which is formed by the physical vapor-phase growth method such as sputtering or deposition or the chemical vapor-phase growth method such as CVD. As for Ti, W, Mo, Ta, Pt, Re and the like, a gas containing Si such as $SiH_4$ and a source gas composed of the halogen compound thereof is reduced by $H_2$ or the like using CVD, to form a metal silicide film. In some case the organic metal compound thereof can be used to form a metal layer by CVD.

In the method of forming a contact-hole of the present invention, other than a silicon semiconductor substrate, there may be used a Ge semiconductor substrate or a compound semiconductor (GaAs) substrate. Moreover, although the work function is controlled in two values corresponding to the n-channel and the p-channel, it may be controlled in three or more kinds of values.

In each embodiment, the contact-hole having the ohmic contact characteristic has been described; however, the present invention may be applied to a contact-hole positively using the Schottky characteristic. Since the Schottky characteristic enables quick response, the device having the Schottky characteristic is suitable for a microwave band operation. Moreover, in the device having the Schottky characteristic, the forward voltage, mode variable by selecting the material, enables a large current rectifier. By forming the contact-hole positively using the Schottky characteristic between a base and collector of a bipolar transistor, that is, by inserting a Schottky diode (clamp diode) between the base and collector of the bipolar transistor, it becomes possible to suppress the storage of minor carriers and shorten the saturated time, and hence to operate the bipolar transistor in a large current region. The device having a contact-hole positively using such a Schottky characteristic may include an optical detector, solar battery, laser diode, phototransistor, Schottky junction collector transistor, microwave varactor diode, microwave avalanche diode, MES FET, Schottky barrier Gunn diode, superconductor Schottky barrier diode, or detector for proton, α-ray, x-ray, γ-ray, and infrared ray. In addition, such a device widely pertains to the semiconductor element of the present invention.

Although the metallization material made of tungsten is deposited in the opening in the embodiments, an aluminum alloy may be deposited on an insulation including the interior of the opening by sputtering, high temperature sputtering or aluminum reflow. The contact-hole and the interconnect layer can be thus simultaneously formed on the insulating layer. In this case, a wettability improving layer made of Ti is preferably formed on the closely contacting layer made of TiN.

The high temperature sputtering is a process of sputtering an aluminum alloy, while holding a substrate at a high temperature (about 500° C.). The aluminum alloy deposited on the insulating layer is made to reflow, and it flows in the opening. As a result, the opening is filled with the aluminum alloy, to form a contact-hole. The aluminum reflow method is a process of sputtering an aluminum alloy, while holding a substrate at a high temperature (about 150° C.) and heating the substrate about 500° C. By heating, the aluminum alloy deposited on the insulating layer is made to flow, and it flows in the opening. As a result, the opening is filled with the aluminum alloy, to form a contact-hole.

The material forming the insulating layer may include the known insulating material such as BPSG, PSG, BSG, AsSG, PbSG, SbSG, SOG, SiON or SiN, or laminated film thereof, other than $SiO_2$. As the aluminum alloy forming the interconnection layer, there may be used pure aluminum, or an aluminum alloy such as Al—Si, Al—Cu, Al—Si—Cu, Al—Ge, Al—Si—Ge or the like.

According to the method of forming a contact-hole of the present invention, it becomes possible to simultaneously control the barrier height $\phi_b$ in the n-channel and p-channel devices, and hence to form the contact-hole having a low contact resistance $\rho_c$. Moreover, this can be made using the conventional fabrication process of the semiconductor element, without increasing the number of processes so much.

The metallization material has been selected by emphasizing the barrier height $\phi_b$ and the contact resistance $\rho_c$. However, according to the present invention, since the barrier height $\phi_b$ can be controlled, the category for the metallization material can be extended, which enables a further feasible design in process and device. Moreover, although the application to the Schottky contact has been related to the selection of the metallization material, the category for the metallization material can be extended.

Although various minor changes and modifications might be proposed by those skilled in the art, it will be understood that we wish to include within the scope of the patent warranted hereon, all such changes and modifications as reasonably come within our contribution to the art.

What is claimed is:

1. A MOS transistor, comprising:

a semiconductor substrate having source and drain regions at a surface thereof;

an insulating layer on the surface of said substrate overlying said source and drain regions and a channel region between said source and drain regions;

a plurality of growth nuclei of a first conductive material in a defined region on said insulating layer overlying said channel region, a density of said growth nuclei being 40 pieces or more per 1 $\mu m^2$;

a first thin film of said first conductive material grown on each of said growth nuclei to form a plurality of island-like regions in said defined region, said island-like regions comprising silicon selectively doped with an impurity;

a second thin film of a second conductive material different than said first conductive material covering all of said island-like regions and also areas between said island-like regions, said second thin film comprising a silicide, and said second thin fill together with said island-like regions forming a complex film acting as a gate electrode; and a work function between said complex film and said substrate being defined by a total area of said island-like regions compared to a total area of said defined region above said channel region, said total area of said island-like regions being less than said total area in said defined region.

2. A transistor according to claim 1 wherein said substrate comprises silicon.

3. A transistor according to claim 1 wherein said silicide comprises tungsten silicide.

4. A transistor according to claim 1 wherein said growth nuclei and said thin film of first conductive material comprises a polysilicon.

5. An MOS transistor, comprising:

a semiconductor substrate having source and drain regions at a surface thereof;

an insulating layer on the surface of said substrate overlying said source and drain regions and a channel region between said source and drain regions;

a plurality of growth nuclei of a first conductive material in a defined region on said insulating layer overlying said channel region, a density of said growth nuclei being 40 pieces or more per 1 $\mu m^2$;

a first thin film of said first conductive material grown on each of said growth nuclei to form a plurality of island-like regions in said defined region, said island-like regions comprising silicon selectively doped with an impurity;

a second thin film of a second conductive material different than said first conductive material covering all of said island-like regions and also areas between said island-like regions, said second thin film comprising a silicide, and said second thin film together with said island-like regions forming a complex film acting as a gate electrode;

a work function between said complex film and said substrate being defined by a total area of said island-like regions compared to a total area of said defined region above said channel region, said total area of said island-like regions being less than said total area of said defined region;

a contact hole through said insulating layer to said source region and another contact hole through said insulating layer to said drain region;

a plurality of growth nuclei of a conductive material on said source region;

a plurality of growth nuclei of a conductive material on said drain region;

a third thin film of said conductive material grown on each of said growth nuclei on said source and drain regions to form a plurality of island-like regions on said source and drain regions;

a fourth thin film of a conductive material different than the conductive material of the island-like regions overlying the source and drain regions, said conductive material of said fourth thin fill overlying said island-like regions and between said island-like regions in order to cover said source and drain regions respectively at said respective contact holes;

said island-like regions and said fourth thin film on said source and drain regions forming respective complex films; and a work function between said complex films at said source and drain regions and said substrate being defined by the total area of said island-like regions respectively lying at said source and drain regions compared to a respective total area in said respective contact holes above said source and drain regions, said total area of said island-like regions respectively at said source and drain regions being less than the respective total area in said contact holes at said respective source and drain regions.

* * * * *